United States Patent [19]

Demaris

[11] Patent Number: 5,136,189
[45] Date of Patent: Aug. 4, 1992

[54] BICMOS INPUT CIRCUIT FOR DETECTING SIGNALS OUT OF ECL RANGE

[75] Inventor: James E. Demaris, Brush Prairie, Wash.

[73] Assignee: National Semiconductor Corporation, Santa Clara, Calif.

[21] Appl. No.: 502,261

[22] Filed: Apr. 2, 1990

[51] Int. Cl.[5] ............... H03K 19/092; H03K 19/094
[52] U.S. Cl. .................................. 307/475; 307/451; 307/455
[58] Field of Search ............... 307/475, 473, 451, 455

[56] References Cited

U.S. PATENT DOCUMENTS

| | | | |
|---|---|---|---|
| 4,469,959 | 9/1984 | Luke et al. | 307/475 |
| 4,616,146 | 10/1986 | Lee et al. | 307/446 |
| 4,695,748 | 9/1987 | Kumamoto | 307/355 |
| 4,760,287 | 7/1988 | Goto et al. | 307/355 |
| 4,871,928 | 10/1989 | Bushey | 307/446 |
| 4,897,564 | 1/1990 | Chen | 307/475 |
| 4,958,091 | 9/1990 | Roberts | 307/475 |
| 4,978,870 | 12/1990 | Chen et al. | 307/475 |

FOREIGN PATENT DOCUMENTS

261900A1 9/1988 Fed. Rep. of Germany.
3900232 9/1989 Fed. Rep. of Germany.

*Primary Examiner*—Edward P. Westin
*Assistant Examiner*—Richard Roseen
*Attorney, Agent, or Firm*—lee Patch; Robert C. Colwell; Gary T. Aka

[57] ABSTRACT

A BiCMOS input circuit which is capable of detecting signals below a particular range, such as ECL signals, is presented. The circuit is useful in conserving the number of pins in a BiCMOS integrated circuit in that a signal below normal ECL levels can trigger special functions, such as testing. The circuit has a plurality of CMOS inverter circuits connected in series with the input node of the first inverter connected to the input terminal of the circuit and the output node of the last inverter circuit connected to the output terminal of the circuit. Diode-connected bipolar transistor created a potential difference between $V_{CC}$ and the source electrode of PMOS transistor of each CMOS inverter circuit in a declining fashion from the first inverter to the last inverter. The last inverter circuit has no potential difference at all so that its output has a full CMOs swing.

18 Claims, 1 Drawing Sheet

BICMOS INPUT CIRCUIT FOR DETECTING SIGNALS OUT OF ECL RANGE

BACKGROUND OF THE INVENTION

The present invention is related to input circuits in integrated circuits and, more particularly, to tristate input circuits useful in BiCMOS integrated circuits.

A common problem with integrated circuits is the limited number of pins which are available to make the electrical connections between an integrated circuit and the outside world. As integrated circuits become more complex and more capable of performing advanced functions, physical constraints keep the number of available pins low. The low pin number can often create a communications bottleneck.

The present invention provides for a technique by which an input pin responds to three states of voltage signals, in contrast to two-state pins in most integrated circuit. This "tristate" technique is particularly adapted to BiCMOS integrated circuits.

BiCMOS integrated circuits are semiconductor devices in which bipolar technology is combined with complementary metal oxide semiconductor (CMOS) technology. In such an BiCMOS integrated circuit, the higher speed, greater power-consuming bipolar transistor circuits are located at the suitable locations in the semiconductor device to use the speed and drive capabilities inherent in bipolar transistors. The CMOS circuits are used wherever higher packing densities and lower power consumption of CMOS circuits are suitable.

Some BiCMOS integrated circuit communicate with the outside world with signal levels appropriate for bipolar logic circuits. CMOS level signals are used within the device. A common bipolar logic used in BiCMOS devices is emitter-coupled logic (ECL) which has a signal range from −0.9 to −1.7 volts. On the other hand, CMOS signals swing in a 5-volt range.

The present invention provides for an input circuit which is responsive to signals having voltage levels below the ECL range. This allows the integrated circuit through the same pin to receive ECL signals for normal communication and special signals at voltage levels below the ECL range for special functions in the BiCMOS device, such as testing and the like.

SUMMARY OF THE INVENTION

The present invention accomplishes the above by providing for a BiCMOS circuit having a plurality of CMOS inverter circuits. The input terminal of the first inverter circuit is connected to the input pad which is connected to an input pin. The source electrode of the PMOS transistor forming the inverter circuit is coupled to a first voltage reference through a first potential difference circuit.

The second CMOS inverter circuit is connected in series with the first inverter circuit with the output terminal of the first inverter connected to the input terminal of the second. Likewise, the source electrode of the PMOS transistor forming the second inverter circuit is coupled to a voltage reference through a second potential difference circuit. The amount of potential difference by this circuit is less than of the first potential difference circuit.

The sequence of series-connected CMOS inverter circuits with corresponding voltage generating circuits continues with the amount of potential difference until the last CMOS inverter circuit has the source electrode of its PMOS transistor of the inverter circuit connected directly to the first voltage reference under ECL input conditions. The last CMOS inverter circuit is capable of a full CMOS voltage swing for CMOS operation.

In implementation it has been found that three CMOS inverter circuits are sufficient. Diode-connected bipolar transistors form the potential difference circuits between the PMOS transistors and the first voltage reference.

DESCRIPTION OF SPECIFIC EMBODIMENTS

Figure 1:
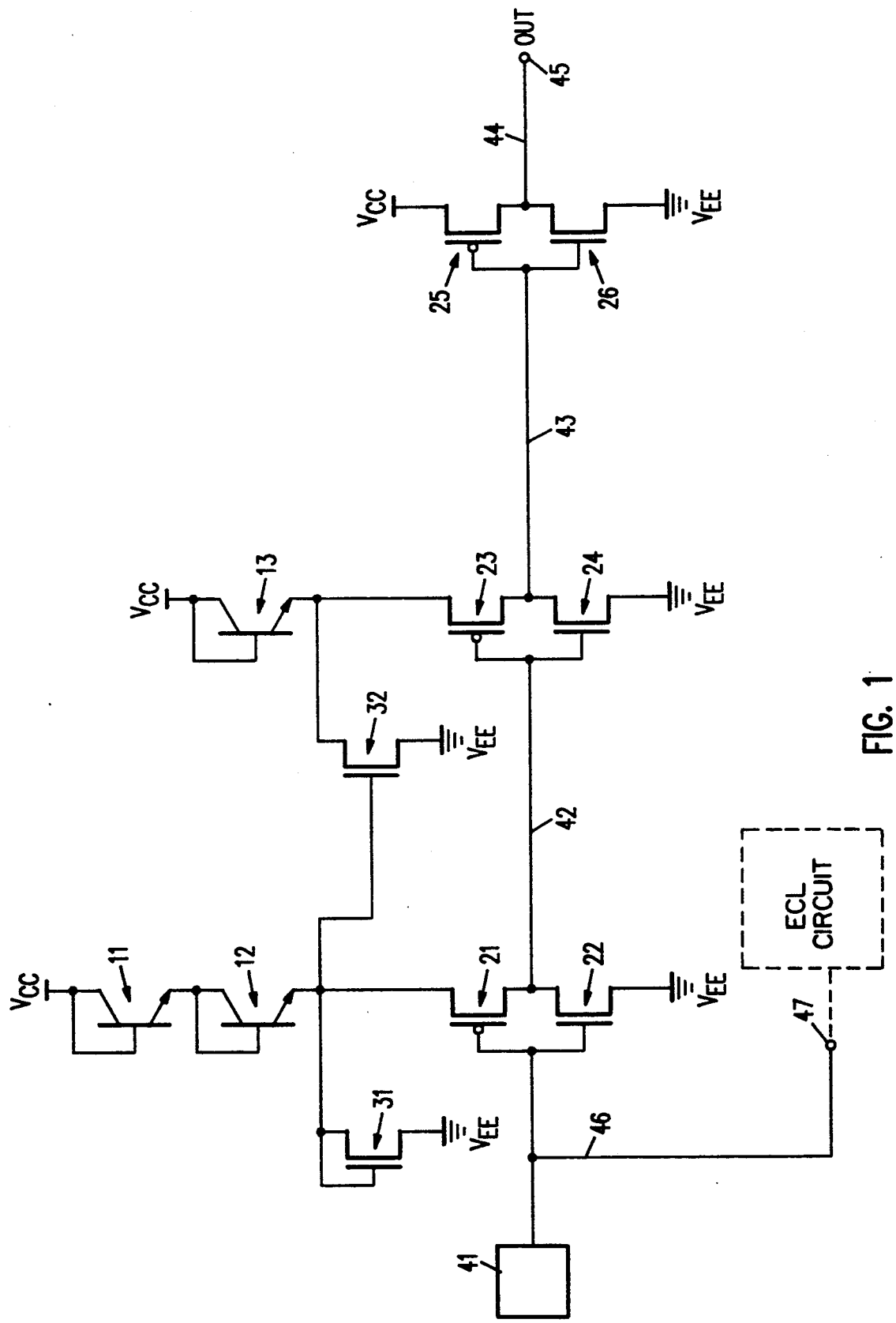
FIG. 1 is a circuit diagram illustrative of the present invention.

FIG. 1 is a circuit diagram illustrating the present invention. An input pad 41 receives signals from a connected input pin (not shown) for transmission to the integrated circuit of which the FIG. 1 circuit is a part. Conventionally most BiCMOS integrated circuits operate between two voltage supplies, references $V_{CC}$ at 0 volts and $V_{EE}$ at −5.2 volts.

The input circuit of FIG. 1 operates between the pad 41 and the output terminal 45. The input circuit has three CMOS inverter circuits formed by a complementary transistor pair 21 and 22, 23 and 24, 25 and 26. The input terminal of first inverter, the commonly connected gate electrodes of the transistors 21, 22, is connected to the input pad 41. The output terminal of that inverter, the common node of the complementary transistor pair 21, 22, is connected to the input node of the next CMOS inverter circuit formed by the complementary transistor pair 23, 24. The output node of the transistor pair 23, 24 is, in turn, connected to the input node of the last inverter circuit formed by the complementary transistor pair 25, 26. The common node of the transistor pair 25, 26, the output node of the inverter, is connected to an output terminal 45.

With respect to the first inverter circuit formed by the transistors 21, 22, the source electrode of the PMOS transistor 21 is coupled to the first voltage reference $V_{CC}$ by two diode-connected bipolar transistors 11, 12. Each of the NPN bipolar transistors 11, 12 have their base and collector electrodes tied together. The bipolar transistors 11, 12 form a first potential difference circuit, which drops the voltage $2V_{BE}$ from 0 volts to about −1.7 volts. The source electrode of the NMOS transistor 22, on the other hand, is connected to the second voltage reference at $V_{EE}$, −5.2 volts.

Additionally, the N-doped substrate in which the PMOS transistor 21 is located, is biased at the source electrode voltage, −1.7 volts. Thus, for input signals in the ECL range, −0.8 to −1.1 volts, the NMOS transistor 22 remains on and the output signal of the inverter remains low. The inverter can switch high only when the input signal voltage falls below $(-1.7-V_T)$, where $V_T$ is the threshold voltage of the PMOS transistor 21. The output voltage of the CMOS inverter of complementary transistor pair 21, 22 can then swing from −5 volts to −1.7 volts.

The CMOS inverter of the complementary transistor pair 23, 24 are also similarly connected. The source electrode of the PMOS transistor 23 is coupled to the first voltage reference $V_{CC}$ through a potential difference circuit, a single NP diode-connected bipolar transistor 13. The transistor 13 has its base and collector electrodes connected to the first voltage reference and its emitter electrode connected to the source electrode of the transistor 23. The source electrode of the transistor 24 is connected to the second voltage reference at $V_{EE}$.

Similar to the transistor 21, the N-substrate of the PMOS transistor 23 is also biased at its source electrode voltage, one $V_{BE}$ below $V_{CC}$. Thus output signal of the CMOS inverter circuit of the transistors 23, 24 operates in a range between $-0.8$ volts one $V_{BE}$ below $V_{CC}$, to $-5.2$ volts while the input signal range is from $-0.8 - \sqrt{T}$ volts, where VT is the threshold voltage of the PMOS transistor 23. In most CMOS processes $V_T$ is typically in the range of 0.75 to 1.1 volts.

The third CMOS inverter circuit formed by the complementary transistor pair 25, 26 is connected to the first voltage reference without any potential difference circuit. The source electrode of the PMOS transistor 25 is at 0 volts, $V_{CC}$, and the source electrode of the NMOS transistor 26 is at $-5.2$ volts, $V_{EE}$. Thus the output signal from the output node of the inverter, the common drain node of the PMOS transistor 25 and the drain node of the NMOS transistor 26, swings in a full CMOS voltage range. The output terminal 45 can provide signal levels to other CMOS circuits in the rest of the integrated circuit.

The FIG. 1 circuit also has additional circuits to keep the two diode-connected bipolar transistors 11, 12 and single diode-connected bipolar transistor 13 turned on all the time. A current source (actually a current sink) formed by an NMOS transistor 31 provides this function to the transistors 11, 12. The transistor 31 has its gate and drain electrodes connected to the emitter electrode of the bipolar transistor 12. The transistor 31 is thus in a diode configuration and draws current from the bipolar transistors 11, 12 to the second reference voltage $V_{EE}$. The drawn current is just large enough to keep the bipolar transistors turned on.

Similarly, to keep the bipolar transistor 13 on, a second current source formed by an NMOS transistor 32, draws current through the bipolar transistor 13. The drain electrode of the transistor 32 is connected to the emitter electrode of the bipolar transistor 13 and the source electrode of the transistor 32 is connected to the second voltage reference $V_{EE}$. The gate electrode of the transistor 32 is coupled to the emitter electrode of the bipolar transistor 12. This connection ensures that the current drawn through the bipolar transistor 13 by the transistor 32 does not become excessively large, but sufficiently large to keep the NPN transistor 13 turned on.

Also connected to the input pad 41 is an input terminal 47 which may be connected to the standard ECL circuits which form the input buffer circuits to a BiCMOS integrated circuit. Thus, signals in the ECL range are propagated into the integrated circuit through the line 46 and terminal 47 for standard operation. When a special operation is required, an input signal lower than the ECL, or more specifically, lower than $-1.7 - V_T$ volts, is impressed upon the input pad 41. This results in a CMOS high level signal at the terminal 45 which could be connected to CMOS circuits to perform a special operation, such as a test operation of the integrated circuit. In this manner an additional input pin is not required for testing; the number of input pins is conserved.

While the above is a complete description of the preferred embodiments of the invention, various alternatives, modifications and equivalents may be used. For example, the present invention has been described with particular voltage displacment circuits and three CMOS inverter circuits. It should be evident that by modifying the voltage displacement circuits and possibly varying the number of inverter circuits, the present invention could detect signals below predetermined voltage ranges, levels different from ECL. Thus the present invention could be adapted to different requirements. Therefore, the above description should not be taken as limiting the scope of the invention which is defined by the appended claims.

What is claimed is:

1. An input circuit for a BiCMOS integrated circuit, said integrated circuit capable of receiving signals in a predetermined range of logic levels through an input terminal, said input circuit connected to said input terminal, comprising a first signal path connecting said input terminal to a circuit responsive to signals in said predetermined range of logic level;

a second signal path having a plurality of CMOS inverter circuits, each inverter circuit having a first power supply node coupled to a first voltage reference, a second power supply node coupled to a second voltage reference, an input node and an output node, said inverter circuits coupled serially to each other from first to last, an output node of one inverter circuit connected to the input node of the following inverter circuit, an input node of said first inverter circuit connected to said input terminal, an output node of said last inverter circuit connected to an output terminal; and potential difference means connected at least between said first power supply node of said first inverter circuit and said first voltage reference, said plurality of CMOS inverter circuits include one or more inverter circuits between said first and last inverter circuits, said potential difference means generating potential differences between said first power supply node of said inverter circuits and said first voltage reference, the potential difference decreasing from said first inverter circuit to said last inverter circuit, said last inverter circuit having no potential difference between said first power supply terminal of said last inverter circuit and said first voltage reference so that said inverters switch states at a signal having a voltage level below said predetermined range of logic level;

whereby said BiCMOS integrated circuit receives signals in said predetermined range of logic level on said first signal path from said input terminal and receives signals on said second signal path from said input terminal to said output terminal only if said signals are below said predetermined range of logic level signals.

2. The input circuit for a BiCMOS integrated circuit as in claim 1 wherein said potential difference means comprises at least one diode-connected bipolar transistor connected in series between said power supply node of said inverter circuits and said first voltage reference.

3. The input circuit for a BiCMOS integrated circuit as in claim 2 wherein said predetermined range comprises ECL voltage levels.

4. The input circuit for a BiCMOS integrated circuit as in claim 2 further comprising a current source connected to said bipolar transistor for maintaining said bipolar transistor in a on state.

5. The input circuit for a BiCMOS integrated circuit as in claim 4 wherein said current source comprises a diode-connected MOS transistor.

6. The input circuit for a BiCMOS integrated circuit as in claim 1 wherein said each of said CMOS inverter circuits comprises a PMOS transistor and an NMOS transistor, each transistor having a source electrode, drain electrode and gate electrode, said drain electrodes of both transistors in common forming said output node, said gate electrodes of both transistors in common forming said input node, said source electrode of said NMOS transistor forming said second voltage supply node, said source electrode of said PMOS transistor forming said first voltage supply node, said substrate of said PMOS transistor held at the same voltage as said PMOS transistor source electrode, whereby said PMOS transistor turns on when the voltage at said input node is lower than the sum of said source electrode voltage and PMOS transistor threshold voltage.

7. The input circuit for a BiCMOS integrated circuit as in claim 6 wherein said potential difference means is such that said PMOS transistor of said first inverter circuit turns on when said input signal is below ECL levels.

8. The input circuit for a BiCMOS integrated circuit as in claim 7 wherein the amount of said potential difference is two $V_{BE}$, the forward base-emitter drop of a bipolar transistor.

9. A BiCMOS circuit having an input terminal and an output terminal, said circuit capable of detecting signals on said input terminal below ECL voltage ranges, said BiCMOS circuit comprising
  a first, second and third CMOS inverter circuits, each having a first power supply node coupled to a first voltage reference, a second power supply node coupled to a second voltage reference, an input node and an output node, said first inverter circuit input node connected to said input terminal, said first inverter output node connected to said second inverter input node, said second inverter output node connected to said third inverter input node, and said third inverter output node connected to said output terminal;
  a first bipolar potential difference means connected between said first power supply node of said first inverter and said first voltage reference; and
  a second bipolar potential difference means connected between said first power supply node of said second inverter and said first voltage reference, the amount of potential difference of said second bipolar potential difference means being less than that of said first bipolar potential difference means;
  whereby said BiCMOS circuit transmits a signal on said input terminal to said output terminal when said signal is below an ECL range of values.

10. The BiCMOS circuit as in claim 9 wherein said first and second bipolar potential difference means comprises at least one diode-connected bipolar transistor.

11. The BiCMOS circuit as in claim 10 wherein said first bipolar potential difference means comprises two diode-connected bipolar transistor in series and said second bipolar potential difference means comprises one diode-connected bipolar transistor.

12. The BiCMOS circuit as in claim 11 further comprising first and second current sources connected to said first and second bipolar potential difference means for maintaining said diode-connected bipolar transistors in an on state.

13. The BiCMOS circuit as in claim 12 wherein said first and second current sources comprise MOS transistors.

14. The BiCMOS circuit as in claim 10 wherein
  said first bipolar potential difference means comprises first and second NPN transistors, each having common base/collector electrodes tied together and an emitter electrode, said first transistor base/collector electrode connected to said first voltage reference, said first transistor emitter electrode connected to said second transistor base/collector electrode, said second transistor emitter electrode connected to said first power supply node of said first inverter;
  said second bipolar potential difference means comprises a third NPN transistor having a common base/collector electrode tied together and an emitter electrode, said third transistor base/collector electrode connected to said first voltage reference, said third transistor emitter electrode connected to said first power supply node of said second inverter circuit.

15. The BiCMOS circuit as in claim 14 further comprising
  said first current source having a first MOS transistor with a common gate/drain electrode and a source electrode, said gate/drain electrode connected to said emitter electrode of said second bipolar transistor; and
  said second current source having a second MOS transistor with a gate electrode, a drain electrode and a source electrode, said drain electrode connected to said emitter electrode of said third transistor and said gate electrode connected to said emitter electrode of said second bipolar transistor.

16. The BiCMOS circuit as in claim 15 wherein said gate electrode of said second MOS transistor is connected to said emitter electrode of said second transistor.

17. The BiCMOS circuit as in claim 9 wherein said each of said CMOS inverter circuits comprises a PMOS transistor and an NMOS transistor, each transistor having a source electrode, drain electrode and gate electrode, said drain electrodes of both transistors in common forming said output node, said gate electrodes of both transistors in common forming said input node, said source electrode of said NMOS transistor forming said second voltage supply node, said source electrode of said PMOS transistor forming said first voltage supply node, said substrate of said PMOS transistor held at the same voltage as said PMOS transistor source electrode, whereby said PMOS transistor turns on when the voltage at said input node is lower than the sum of said source electrode voltage and PMOS transistor threshold voltage.

18. The BiCMOS circuit as in claim 9 further comprising a signal path connecting said input terminal to a circuit responsive to ECL level signals.

* * * * *